US010141117B2

(12) United States Patent
Vak

(10) Patent No.: US 10,141,117 B2
(45) Date of Patent: Nov. 27, 2018

(54) PROCESS OF FORMING A PHOTOACTIVE LAYER OF A PEROVSKITE PHOTOACTIVE DEVICE

(71) Applicant: COMMONWEALTH SCIENTIFIC AND INDUSTRIAL RESEARCH ORGANISATION, Acton, ACT (AU)

(72) Inventor: Doojin Vak, Nobel Park North (AU)

(73) Assignee: COMMONWEALTH SCIENTIFIC AND INDUSTRIAL RESEARCH ORGANISATION, Acton (AU)

( * ) Notice: Subject to any disclaimer, the term of this patent is extended or adjusted under 35 U.S.C. 154(b) by 0 days.

(21) Appl. No.: 15/119,835

(22) PCT Filed: Feb. 24, 2015

(86) PCT No.: PCT/AU2015/000100
§ 371 (c)(1),
(2) Date: Aug. 18, 2016

(87) PCT Pub. No.: WO2015/127494
PCT Pub. Date: Sep. 3, 2015

(65) Prior Publication Data
US 2017/0084399 A1   Mar. 23, 2017

(30) Foreign Application Priority Data
Feb. 26, 2014   (AU) .............................. 2014900630

(51) Int. Cl.
*H01L 51/00*   (2006.01)
*H01G 9/20*   (2006.01)
*H01L 51/42*   (2006.01)
*H01L 27/30*   (2006.01)
*H01L 51/44*   (2006.01)
*H01L 31/0256*   (2006.01)

(52) U.S. Cl.
CPC ......... *H01G 9/2009* (2013.01); *H01L 27/302* (2013.01); *H01L 51/0003* (2013.01);
(Continued)

(58) Field of Classification Search
CPC ...................................................... H01L 27/28
See application file for complete search history.

(56) References Cited

U.S. PATENT DOCUMENTS 5,871,579 A * 2/1999 Liang ........................ C23C 2/04
117/54
9,248,115 B2 * 2/2016 Rovati ................. A61K 31/357
(Continued)

FOREIGN PATENT DOCUMENTS

JP   2008-176998      7/2008
JP   2008176998 A  *  7/2008
(Continued)

OTHER PUBLICATIONS

JP2008-176998A, machine translation, 2008.*
(Continued)

*Primary Examiner* — Robert A Vetere
(74) *Attorney, Agent, or Firm* — Joseph P. Meara; Foley & Lardner LLP

(57) ABSTRACT

A process of forming a thin film photoactive layer of a perovskite photoactive device comprising: applying at least one coating of a perovskite precursor solution and a polymer additive to a substrate, wherein the at least one perovskite precursor solution comprises at least one reaction constituent for forming at least one perovskite compound having the formula $AMX_3$ dissolved in a coating solvent selected from at least one polar aprotic solvent, the polymer additive being soluble in said coating solvent, and in which A comprises an ammonium group or other nitrogen containing organic cation, M is selected from Pb, Sn, Ge, Ca, Sr, Cd, Cu, Ni, Mn, Co, Zn, Fe, Mg, Ba, Si, Ti, Bi, or In, and X is selected from at least one of F, Cl, Br or I.

23 Claims, 2 Drawing Sheets

| Type A | Type B | |
|---|---|---|
| Metal (or any conductor) | Metal (or any conductor) | Transparent conductor (TCO, conducting polymer or thin metal) with or without collecting grids |
| Electron transporting layer (inorganic or organic semiconductor) | Hole transporting layer (organic or inorganic semiconductor) | Top cell (Perovskite solar cell either type A or B) |
| Perovskite layer | Perovskite layer | Transparent conductor (TCO, conducting polymer or thin metal) with or without conducting grids |
| Hole transporting layer (organic or inorganic semiconductor) | Electron transporting layer (inorganic or organic semiconductor) | Bottom cell (perovskite, organic, inorganic or silicon solar cell) |
| Transparent conductor (TCO, conducting polymer or thin metal) with or without conducting grids | Transparent conductor (TCO, conducting polymer or thin metal) with or without conducting grids | Metal (or conductor) (optional) Substrate (glass, plastic, metal, or ceramic) |
| Substrate (glass, plastic, metal, or ceramic) | Substrate (glass, plastic, metal, or ceramic) | |

A            B            C

(52) U.S. Cl.
CPC ...... *H01L 51/0004* (2013.01); *H01L 51/0036* (2013.01); *H01L 51/0077* (2013.01); *H01L 51/424* (2013.01); *H01L 51/442* (2013.01); *H01L 51/0037* (2013.01); *H01L 51/4213* (2013.01); *H01L 51/4246* (2013.01); *H01L 2031/0344* (2013.01); *Y02E 10/549* (2013.01)

(56) References Cited

U.S. PATENT DOCUMENTS

| | | | |
|---|---|---|---|
| 2013/0136937 | A1 | 5/2013 | Fujii et al. |
| 2015/0129034 | A1* | 5/2015 | Snaith ................. H01L 51/4213 136/258 |

FOREIGN PATENT DOCUMENTS

| | | |
|---|---|---|
| JP | 2012-224508 | 11/2012 |
| WO | WO-2013/171517 | 11/2013 |
| WO | WO-2013/171518 | 11/2013 |
| WO | WO-2013/171520 A1 | 11/2013 |
| WO | WO-2014/181072 A1 | 11/2014 |

OTHER PUBLICATIONS

Heo et al., "Efficient inorganic—organic hybrid heterojunction solar cells containing perovskite compound and polymeric hole conductors," 2013, Nature Photonics, vol. 7, pp. 486-492.*

Liu et al., "Perovskite solar cells with a planar heterojunction structure prepared using room-temperature solution processing techniques," 2013, Nature Photonics, vol. 8, pp. 133-139.*

Heo, J. H. et al, "Efficient inorganic-organic hybrid heterojunction solar cells containing perovskite compound and polymeric hole conductors", Nature Photonics, 2013, vol. 7, p. 486-491.

International Preliminary Report on Patentability (Chapter II of the Patent Cooperation Treaty) in International Application No. PCT/AU2015/000100, dated Jun. 10, 2016 (26 pages).

International-Type Search Report in AU Application No. 2014900630, dated Jul. 4, 2014 (10 pages).

International Search Report & Written Opinion of the International Preliminary Examining Authority in International Application No. PCT/AU2015/000100, dated Dec. 21, 2015 (11 pages).

Cheng et al, "Layered organic-inorganic hybrid perovskites: structure, optical properties, film preparation, patterning and templating engineering," CrystEngComm, vol. 12, No. 10, Jul. 6, 2010, pp. 2646-2662.

Extended European Search Report in EP Application No. 15755335.5, dated Sep. 28, 2017 (10 pages).

Wei et al., "Strong exciton-photon coupling in microcavities containing new fluorophenethylamine based perovskite compounds," Optics Express, vol. 20, No. 9, Apr. 20, 2012, pp. 3314-3317.

Yu et al., "Effects of poly(ethylene glycol) additive molecular weight on the microstructure and properties of sol-gel-derived lead zirconate titanate thin films," Journal of Materials Research, vol. 18, No. 3, Mar. 2003, pp. 737-741.

* cited by examiner

| Type A | Type B | |
|---|---|---|
| Metal (or any conductor) | Metal (or any conductor) | Transparent conductor (TCO, conducting polymer or thin metal) with or without collecting grids |
| Electron transporting layer (inorganic or organic semiconductor) | Hole transporting layer (organic or inorganic semiconductor) | Top cell (Perovskite solar cell either type A or B) |
| Perovskite layer | Perovskite layer | Transparent conductor (TCO, conducting polymer or thin metal) with or without conducting grids |
| Hole transporting layer (organic or inorganic semiconductor) | Electron transporting layer (inorganic or organic semiconductor) | Bottom cell (perovskite, organic, inorganic or silicon solar cell) |
| Transparent conductor (TCO, conducting polymer or thin metal) with or without conducting grids | Transparent conductor (TCO, conducting polymer or thin metal) with or without conducting grids | Metal (or conductor) (optional) Substrate (glass, plastic, metal, or ceramic) |
| Substrate (glass, plastic, metal, or ceramic) | Substrate (glass, plastic, metal, or ceramic) | |
| A | B | C |

FIGURE 1

Perovskite (CH$_3$NH$_3$PbI$_3$) only

A

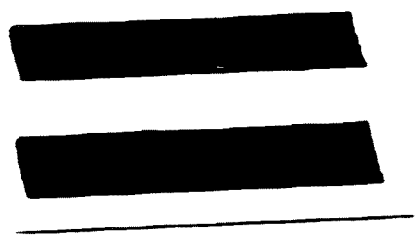
Perovskite with 1.5 wt% PVAc

PROCESS OF FORMING A PHOTOACTIVE LAYER OF A PEROVSKITE PHOTOACTIVE DEVICE

CROSS-REFERENCE TO RELATED APPLICATIONS

This application is a U.S. National Stage Application under 35 U.S.C. § 371 of International Application No. PCT/AU2015/000100, filed on Feb. 24, 2015, which claims priority to AU Application No. 2014900630, filed on Feb. 26, 2014, the contents of which are hereby incorporated by reference in their entirety.

TECHNICAL FIELD

The present invention generally relates to a process of forming a photoactive layer of a perovskite photoactive device. The invention is particularly applicable for perovskite type solar cells and it will be convenient to hereinafter disclose the invention in relation to that exemplary application.

BACKGROUND TO THE INVENTION

The following discussion of the background to the invention is intended to facilitate an understanding of the invention. However, it should be appreciated that the discussion is not an acknowledgement or admission that any of the material referred to was published, known or part of the common general knowledge as at the priority date of the application.

Photovoltaic (PV) cells that convert sunlight directly into electricity are becoming increasingly important in the world's renewable energy mix. Currently, around 85% of PV cells have a photoactive element based on crystalline Si, with the rest being polycrystalline thin film PV cells, mostly cadmium telluride/cadmium sulfide ones. Thin-film cells tend to be cheaper to make with a shorter energy payback time. A rapidly developing newcomer to the thin film PV field is based on organic-inorganic perovskite-structured semiconductors, the most common of which is the triiodide ($CH_3NH_3PbI_3$). Such Perovskites tend to have high charge-carrier mobilities and therefore make ideal photoactive components.

Large scale production of these types of PV cells is difficult because the process of applying the photoactive layer has been found to be difficult to scale. Currently, spin coating has been used at the lab scale to coat a perovskite precursor solution onto a substrate. Spin coating allows for the formation of very homogenous films over an area up to 300 mm in diameter. In a spin coating process, a liquid is applied to a substrate prior to or after acceleration of the substrate to a chosen speed. The substrate spins rapidly and solution on the substrate spreads and dries. Therefore, formation of large size crystals can be minimized or controlled. However, it is not possible to use spin coating on a larger scale. In a scalable coating/printing process, for example dipping or wet coating, a wet film of coating material is formed first and then dried. This has a significantly different solution dynamic and drying time compared to spin coating. In wet coating, the wet film is susceptible to dewetting, non-homogenous crystal formation and/or the formation of pinholes, all of which have undesirable effects on the function of the photoactive layer. These problems become increasingly more serious the greater the amount and area to which the crystalline material is applied.

It is therefore desirable to provide a new and/or improved process or method of forming a photoactive layer of a perovskite photoactive device such as a solar cell.

SUMMARY OF THE INVENTION

The present invention relates to a method to improve processability of photoactive layer of a thin film perovskite photoactive device. The present invention provides in a first aspect a process of forming a photoactive layer of a perovskite photoactive device comprising:

applying at least one coating of at least one perovskite precursor solution and at least one polymer additive to a substrate, wherein the at least one perovskite precursor solution comprises at least one reaction constituent for forming at least one perovskite compound having the formula $AMX_3$ dissolved in a coating solvent selected from at least one polar aprotic solvent, the polymer additive being soluble in said coating solvent, and in which A comprises an ammonium group or other nitrogen containing organic cation, M is selected from Pb, Sn, Ge, Ca, Sr, Cd, Cu, Ni, Mn, Co, Zn, Fe, Mg, Ba, Si, Ti, Bi, or In, and X is selected from at least one of F, Cl, Br or I.

The inventor has found that formation of a photoactive layer of perovskite crystals undergoes rapid crystallisation when applied to a substrate. This crystallisation process forms the crystal structure very rapidly while the film is wet. When the process is scaled up, a continuous film layer comprising a uniform crystal structure is difficult to fabricate due to this rapid crystallisation.

The inventor has discovered that a polymer additive acts as a surprisingly effective crystallisation retardant for perovskite crystallisation, providing a useful and effective retardation of the crystallisation rate of a perovskite precursor solution. The present invention therefore enables the photoactive layer to be crystallised in a more regulated rate through the addition of a polymer additive to the perovskite precursor solution.

In some embodiments, the perovskite precursor solution comprises an ink. In such embodiments, the applying step of the invention comprises the step of applying an ink containing a soluble perovskite precursor and a soluble polymer additive to a substrate. The ink preferably comprises a perovskite precursor solution including at least one polymer additive according to the present invention, the soluble perovskite precursor comprising at least one reaction constituent for forming at least one perovskite compound having the formula $AMX_3$. In this method, both the perovskite precursor and polymer additive are soluble in at least one polar aprotic solvent. The ink preferably comprises a mixture of the soluble perovskite precursor and the soluble polymer additive and is applied to the substrate in a single layer.

The selected crystallisation retardant comprises a polymer. Without wishing to be limited to any one theory, the Applicant considers that a polymer provides an advantageous crystallisation retardant as it provides a long chain molecule within the crystal structure. The long chains of the polymer provide surprisingly effective retardation effect on the crystallisation rate of the perovskite compound that only a small amount of polymer needs to be added to the solution to retard the crystallisation rate of the perovskite compound a sufficient amount to enable a substantially uniform layer to be formed. A small amount of impurity within the perovskite layer is also preferable so as to not interfere with the electro-active properties of that layer. Additionally, the small concentration can in some embodiments facilitate removal of the polymer without substantial effect on the formed or forming crystal structure.

As the perovskite layer is electro-active, a non-electroactive or insulating polymer is preferred. The selected polymer of the present invention must also be soluble in a polar aprotic solvent, preferably a highly polar aprotic solvent. Suitable coating solvents include, but should not be limited to, at least one of Dimethylformamide (DMF), Dimethyl sulfoxide (DMSO), γ-butyrolactone (GBL), acetone, acetyl acetone, ethyl acetoacetate, N-Methyl-2-pyrrolidone (NMP), Dimethylacetamide (DMAC), Tetrahydrofuran (THF) or combinations thereof. In preferred embodiments, the coating solvent comprises Dimethylformamide (DMF).

A large number of polymers additives can be used in the present invention. In some embodiments, the polymer is selected from the group consisting of poly vinyl alcohol, poly vinyl acetate (PVAc), Acrylonitrile butadiene styrene (ABS), poly amides, poly acrylics, poly imide, poly acrylonitrile, poly butyl methacrylate, poly butadiene, poly carboxy methyl cellulose, poly ethers, poly ethylene acrylates, poly glycols, poly isocyanates, poly methacrylates, poly vinyl butyral, poly vinyl fluoride, poly vinyl methyl ethers, poly amines, polyethylene oxide, polyethylene glycol, Poly (2-ethyl-2-oxazoline) and combinations thereof. In some embodiments, the polymer comprises polyethylene oxide. In other embodiments, the polymer comprises Poly(2-ethyl-2-oxazoline) (PEOXA). In a preferred embodiment, the polymer additive comprises poly vinyl acetate, polyethylene glycol, or combinations thereof. In another embodiment, the polymer comprises a poly amine or a hydrochloride salt thereof, such as polyethyleneimine, polyallylamine, a hydrochloride salt thereof or combinations thereof. However, it should be appreciated that other polymers may also be used in the process of the present invention.

As noted previously, the long chain structure of a polymer chain is able to effectively interfere with crystal formation of the perovskite compound. Accordingly, the addition of very small amount of a polymer additive can dramatically improve the processability of perovskite solution. In some embodiments, the polymer additive comprises from 0.01 to 20 wt % of reaction constituent for forming at least one perovskite compound. However, the polymer addition can preferably comprise from 0.05 to 18 wt % of reaction constituent, more preferably from 0.05 to 15 wt %, yet more preferably from 0.1 to 10 wt %, even more preferably from 0.1 to 5 wt %, yet more preferably from 0.1 to 2 wt % of reaction constituent. In one embodiment, the polymer additive comprises about 1.5 wt % of reaction constituent.

Where the polymer additive is dissolved with the reaction constituent for forming at least one perovskite compound in the perovskite precursor solution, the polymer additive comprises from 0.01 to 20 wt % of perovskite precursor solution. However, the polymer addition can preferably comprise from 0.05 to 18 wt % of perovskite precursor solution, more preferably from 0.05 to 15 wt %, yet more preferably from 0.1 to 10 wt %, even more preferably from 0.1 to 5 wt %, yet more preferably from 0.1 to 2 wt % of perovskite precursor solution. In one embodiment, the polymer additive comprises about 1.5 wt % of perovskite precursor solution.

The perovskite compound comprises a molecule which crystallises with perovskite structure. The term "perovskite", as used herein, refers to a material with a three-dimensional crystal structure related to that of $CaTiO_3$ or a material comprising a layer of material, wherein the layer has a structure related to that of $CaTiO_3$. The structure of $CaTiO_3$ can be represented by the formula $AMX_3$, wherein A and M are cations of different sizes and X is an anion. M is selected from Pb, Sn, Ge, Ca, Sr, Cd, Cu, Ni, Mn, Co, Zn, Fe, Mg, Ba, Si, Ti, Bi, or In and X is selected from at least one of F, Cl, Br or I. In many embodiments, M comprises a metal cation, and more preferably a divalent metal cation such as $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. In some embodiments, the second cation may be selected from $Sn^{2+}$, $Pb^{2+}$ and $Cu^{2+}$. In preferred embodiments, M is selected from Pb, Sn, Ge, Si, Ti, Bi, or In.

In some embodiments, the perovskite compound formed from the reaction of the reaction constituents AX and $MX_2$ preferably comprises an organo-metal halide perovskite. The ammonium group or other nitrogen containing organic cation (A) in this type of perovskite compound can comprise a large number of organic cation including protonated alkylamines, cycloalkylamines (such as pyrrolidine or cyclohexyl amine) arylamines and aromatic heterocycles (such as pyridine). In some embodiments, A comprises cations having the general formula $RCH_2NH_3^+$, $RC(NH_2)_2^+$, $R_aR_bCH_1NH_3^+$, $R_aR_bR_cCNH_3^+$, $R_aR_bN H_2^+$, or $R_aR_b R_cNH^+$, where R, $R_a$, $R_b$, $IR_c$ comprises H or a substituted or unsubstituted alkyl group or groups, preferably a $C_1$ to $C_6$ substituted or unsubstituted alkyl or aryl group or groups. Whilst a number of organo-metal halide perovskite are possible, preferred A of the perovskite compound comprises at least one of $CH_3NH_3^+$, or $HC(NH_2)_2^+$.

In some embodiments, organic cation (A) comprises an organic cation having the formula $(R_1R_2R_3R_4N)$, wherein: $R_1$ is hydrogen, unsubstituted or substituted C1-C20 alkyl, or unsubstituted or substituted aryl; $R_2$ is hydrogen, unsubstituted or substituted C1-C20 alkyl, or unsubstituted or substituted aryl; $R_3$ is hydrogen, unsubstituted or substituted C1-C20 alkyl, or unsubstituted or substituted aryl; and $R_4$ is hydrogen, unsubstituted or substituted C1-C20 alkyl, or unsubstituted or substituted aryl.

In some embodiments, organic cation (A) comprises an organic cation having the formula $(R_5R_6N=CH-NR_7R_8)$, wherein: $R_5$ is hydrogen, unsubstituted or substituted C1-C20 alkyl, or unsubstituted or substituted aryl; $R_6$ is hydrogen, unsubstituted or substituted C1-C20 alkyl, or unsubstituted or substituted aryl; $R_7$ is hydrogen, unsubstituted or substituted C1-C20 alkyl, or unsubstituted or substituted aryl; and $R_8$ is hydrogen, unsubstituted or substituted C1-C20 alkyl, or unsubstituted or substituted aryl.

In some embodiments, $R_1$ in the organic cation is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Alternatively, the organic cation may have the formula $(R_5NH_3)^+$ wherein: $R_5$ is hydrogen, or unsubstituted or substituted C1-C20 alkyl. For instance, $R_5$ may be methyl or ethyl. Typically, $R_5$ is methyl.

In some embodiments, the organic cation has the formula $R_5R_6N=CH-NR_7R_8$ wherein: $R_5$ is hydrogen, unsubstituted or substituted C1-C20 alkyl, or unsubstituted or substituted aryl; $R_5$ is hydrogen, unsubstituted or substituted C1-C20 alkyl, or unsubstituted or substituted aryl; $R_7$ is hydrogen, unsubstituted or substituted C1-C20 alkyl, or unsubstituted or substituted aryl; and $R_8$ is hydrogen, unsubstituted or substituted C1-C20 alkyl, or unsubstituted or substituted aryl. Typically, $R_5$ in the cation is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl. The organic cation may, for example, have the formula $(H_2N=CH—NH_2)^+$.

As used herein, an alkyl group can be a substituted or unsubstituted, linear or branched chain saturated radical, it is often a substituted or an unsubstituted linear chain saturated radical, more often an unsubstituted linear chain saturated radical. A C1-C20 alkyl group is an unsubstituted or substituted, straight or branched chain saturated hydrocarbon radical. Typically it is C1-C10 alkyl, for example methyl, ethyl, propyl, butyl, pentyl, hexyl, heptyl, octyl, nonyl or decyl, or C1-C6 alkyl, for example methyl, ethyl, propyl, butyl, pentyl or hexyl, or C1-C4 alkyl, for example methyl, ethyl, i-propyl, n-propyl, t-butyl, s-butyl or n-butyl.

When an alkyl group is substituted it typically bears one or more substituents selected from substituted or unsubstituted C1-C20 alkyl, substituted or unsubstituted aryl (as defined herein), cyano, amino, C1-C10 alkylamino, di(C1-C10) alkylamino, arylamino, diarylamino, arylalkylamino, amido, acylamido, hydroxy, oxo, halo, carboxy, ester, acyl, acyloxy, C1-C20 alkoxy, aryloxy, haloalkyl, sulfonic acid, sulfhydryl (i.e. thiol, —SH), d-C10 alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a C1-C20 alkyl group in which at least one hydrogen atom has been replaced with an aryl group. Examples of such groups include, but are not limited to, benzyl (phenylmethyl, $PhCH_2$—), benzhydryl ($Ph_2CH$—), trityl (triphenylmethyl, $Ph_3C$—), phenethyl (phenylethyl, $Ph-CH_2CH_2$—), styryl ($Ph-CH=CH$—), cinnamyl ($Ph-CH=CH—CH_2$—). Typically a substituted alkyl group carries 1, 2 or 3 substituents, for instance 1 or 2.

An aryl group is a substituted or unsubstituted, monocyclic or bicyclic aromatic group which typically contains from 6 to 14 carbon atoms, preferably from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from C1-C6 alkyl which is unsubstituted (to form an aralkyl group), aryl which is unsubstituted, cyano, amino, C1-C10 alkylamino, di(C1-C10)alkylamino, arylamino, diarylamino, arylalkylamino, amido, acylamido, hydroxy, halo, carboxy, ester, acyl, acyloxy, C1-C20 alkoxy, aryloxy, haloalkyl, sulfhydryl (i.e. thiol, —SH), C1-C10 alkylthio, arylthio, sulfonic acid, phosphoric acid, phosphate ester, phosphonic acid and phosphonate ester and sulfonyl. Typically it carries 0, 1, 2 or 3 substituents. A substituted aryl group may be substituted in two positions with a single C1-C6 alkylene group, or with a bidentate group represented by the formula —X—(C1-C6)alkylene, or —X—(C1-C6)alkylene-X—, wherein X is selected from O, S and R, and wherein R is H, aryl or C1-C6 alkyl. Thus a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance as specified above for aryl. Typically it carries 0, 1, 2 or 3 substituents.

The perovskite semiconductor layer of the invention typically comprises at least one anion X selected from halide anions and chalcogenide anions. The term "halide" refers to an anion of a group 7 element, i.e., of a halogen. Typically, halide refers to a fluoride anion, a chloride anion, a bromide anion, an iodide anion or an astatide anion. The term "chalcogenide anion", as used herein refers to an anion of a group 6 element, i.e. of a chalcogen. Typically, chalcogenide refers to an oxide anion, a sulphide anion, a selenide anion or a telluride anion. In preferred embodiments, the anion X is selected from at least one of F, Cl, Br or I.

In some embodiments, the perovskite compound comprises an organo-metal halide perovskite. In these embodiments, the first cation A is an organic cation, more preferably an ammonium group or other nitrogen containing organic cation. This organic cation (A) in this type of perovskite can comprise a large number of organic cation including protonated alkylamines, cycloalkylamines (such as pyrrolidine or cyclohexyl amine) arylamines and aromatic heterocycles (such as pyridine). In some embodiments, A comprises cations having the general formula $RCH_2NH_3^+$, $RC(NH_2)_2^+$, $R_aR_bCH_1NH_3^+$, $R_aR_bR_cCNH_3^+$, $R_aR_bNH_2^+$, or $R_aR_b R_cNH^+$, where R, $R_a$, $R_b$, $R_c$ comprises H or a substituted or unsubstituted alkyl group or groups, preferably a $C_1$ to $C_6$ substituted or unsubstituted alkyl or aryl group or groups.

Whilst a number of organo-metal halide perovskite are possible, preferred A of perovskite compound $AMX_3$ and its reactant constituent AX comprises at least one of $CH_3NH_3^+$, or $HC(NH_2)_2^+$. Thus, in some embodiments the perovskite reaction constituent AX is selected from the group consisting of $CH_3NH_3X$ and $HC(NH_2)_2X$, and wherein X is selected from at least one of F, Cl, Br or I. For example, perovskite reaction constituent may comprise a mixture of $CH_3NH_3Cl$ and $CH_3NH_3I$. Accordingly, in preferred embodiments AX comprises $CH_3NH_3X$.

The resulting perovskite layer preferably comprises an organo-metal halide perovskite. Thus, in preferred embodiments, the perovskite compound comprise at least one of $CH_3NH_3MX_3$ or $HC(NH_2)_2MX_3$, in which, M is selected from Pb, Sn, Ge, Ti, Bi, or In; and X is selected from at least one of F, Cl, Br or I. Preferably, the perovskite compound comprises an organo-lead halide perovskite, preferably comprising at least one of $CH_3NH_3PbX_3$ or $HC(NH_2)_2PbX_3$, in which X is selected from at least one of F Cl, Br or I.

In some embodiments, in an optoelectronic device containing a perovskite photoactive layer of the present invention, the perovskite compound is selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ or $CH_3NH_3SnF_2Cl$.

Of course, X does not necessarily need to be a single halide. The resulting perovskite compound/layer can include a mixed halide perovskite wherein X in $CH_3NH_3MX_3$ or $HC(NH_2)_2MX_3$ comprises two or more of F, Cl, Br or I. Accordingly, $CH_3NH_3MX_3$ could comprise $CH_3NH_3MCl_xI_{3-x}$, $CH_3NH_3MI_{3-x}Cl_x$ or similar. It should be appreciated that $CH_3NH_3MCl_xI_{3-x}$, $CH_3NH_3MI_{3-x}Cl_x$ or similar can comprise non-stoichiometric materials in which M is selected from at least one of Pb, Sn, Ge, Si, Ti, Bi, or In, preferably M is Pb. In an exemplary embodiment, the perovskite layer is one of the family $CH_3NH_3PbCl_xI_{3-x}$. In preferred embodiments, x is close to zero (i.e. very small chloride content). In other embodiments, x=0 providing a tri-iodide perovskite material layer.

The perovskite precursor solution comprises the above reaction constituent dissolved in the coating solvent. In other embodiments, the perovskite compound may be dissolved in the coating solvent. In some embodiments, the perovskite precursor solution comprises from 5 to 75 wt % perovskite compound or reaction constituent for forming at least one perovskite compound. In some embodiments, the perovskite precursor solution comprises from 10 to 70 wt % perovskite compound or reaction constituent, more preferably from 20 to 60 wt % perovskite compound or reaction constituent, yet more preferably from 25 to 50 wt % perovskite compound or reaction constituent. In one embodiment, the perovskite precursor solution comprises about 40 wt % perovskite compound or reaction constituent.

The applied coating can be applied in a single coating step or in two or more coating steps, with separate components of the coating applied in successive layers onto the substrate.

In some embodiments, the applied coating comprises a mixture of the perovskite precursor solution and the polymer additive. In these embodiments, the perovskite precursor solution comprises a mixture of at least one $MX_2$, at least one AX and at least one polymer additive dissolved in the coating solvent, in which A comprises an ammonium group or other nitrogen containing organic cation, M is selected from Pb, Sn, Ge, Ca, Sr, Cd, Cu, Ni, Mn, Co, Zn, Fe, Mg, Ba, Si, Ti, Bi, or In, and X is selected from at least one of F, Cl, Br or I. The mixture is preferably applied as a single coat onto the substrate. It should be appreciated that one or more coatings or layers of that mixture could be applied to form the final photoactive layer.

In other embodiments, the applied coating is applied in two or more coatings. For example, in some embodiments the polymer additive could be applied to the substrate as a first layer and the precursor solution applied onto that layer as a second layer.

In one form of this embodiment, the step of applying at least one coating can comprise:

coating at least one layer of a first perovskite precursor solution comprising at least one $MX_2$ and polymer additive dissolved in the coating solvent, thereby forming a perovskite precursor coating;

wherein M is selected from at least one of Pb, Sn, Ge, Ca, Sr, Cd, Cu, Ni, Mn, Co, Zn, Fe, Mg, Ba, Si, Ti, Bi, or In; and X is selected from at least one of F, Cl, Br or Accordingly, a film or layer of the first perovskite precursor solution is formed on the substrate. This layer includes the reaction component $MX_2$. A perovskite layer can then be formed by converting the $MX_2$ component to $AMX_3$. This is preferably conducted by using the following second step. Here, the step of applying at least one coating further comprises coating at least one layer of a second perovskite precursor solution comprising at least one of AX dissolved in a further coating solvent onto the perovskite precursor coating, wherein X is selected from at least one of F, Cl, Br or I; and A comprises an ammonium group or other nitrogen containing organic cation.

The application of AX facilitates reaction with $MX_2$ component to result in the desired perovskite compound $AMX_3$.

In some embodiments, the applied coating is applied in at least two layers using reactant species which react once the coating layers mix to form the perovskite structure. For example, in some embodiments the step of applying at least one coating comprises:

coating at least one layer of at least one $MX_2$ and polymer additive; and coating at least one layer of at least one of AX, wherein M is selected from Pb, Sn, Ge, Ca, Sr, Cd, Cu, Ni, Mn, Co, Zn, Fe, Mg, Ba, Si, Ti, Bi, or In and X is selected from at least one of F, Cl, Br or I; and A comprises an ammonium group or other nitrogen containing organic cation.

In these sequential type coatings, once the layers are applied $MX_2$ and AX react to form $AMX_3$, and then the polymer additive acts as a retardant to the subsequent crystallisation of the $AMX_3$ perovskite layer.

Again, the various layers can be applied in single or multiple coatings and/or layers. For example, in some embodiments, the polymer additive can be applied to the substrate, followed by a layer of $MX_2$, subsequently followed by a coating/layer of AX. In other embodiments, one layer of a $MX_2$ and polymer additive are applied as a mixture. In a preferred form of this sequential coating method, the step of applying at least one coating comprises:

coating at least one layer of a first perovskite precursor solution comprising at least one $MX_2$ and polymer additive dissolved in the coating solvent; and coating at least one layer of a second perovskite precursor solution at least one of AX dissolved in a further coating solvent, wherein M is selected from at least one of Pb, Sn, Ge, Ca, Sr, Cd, Cu, Ni, Mn, Co, Zn, Fe, Mg, Ba, Si, Ti, Bi, or In; X is selected from at least one of F, Cl, Br or I; and A comprises an ammonium group or other nitrogen containing organic cation.

In a preferred embodiment the applied coating comprises:

applying a layer of the first perovskite precursor solution onto the substrate; and coating at least one layer of the second perovskite precursor solution onto the first perovskite precursor solution layer.

The first and second precursor solutions comprise reactants $MX_2$ and AX for $AMX_3$ which crystallises with perovskite structure.

In this embodiment, the process of the present invention comprises a sequential coating or deposition process of forming the perovskite layer which includes at least two steps. The process steps comprise a first coating step in which a first precursor solution comprising $MX_2$ dissolved in the coating solvent is applied to a substrate, followed by a second step comprising a conversion process to $AMX_3$. Preferably, a coating of AX (dissolved in a further coating solvent) is applied to the first coating which reacts with $MX_2$ to convert $MX_2$ to $AMX_3$.

The first perovskite precursor solution comprises the component $MX_2$ dissolved in the coating solvent. In some embodiments, the second precursor solution comprises from 5 to 75 wt % $MX_2$. In some embodiments, the second precursor solution comprises from 10 to 70 wt % $MX_2$, more preferably from 20 to 60 wt % $MX_2$, yet more preferably from 25 to 50 wt % $MX_2$. In one embodiment, the second precursor solution comprises about 40 wt % $MX_2$.

The second perovskite precursor solution comprises the component AX dissolved in the further coating solvent. In some embodiments, the second precursor solution comprises from 5 to 75 wt % AX. In some embodiments, the second precursor solution comprises from 10 to 70 wt % AX, more preferably from 20 to 60 wt % AX, yet more preferably from 25 to 50 wt % AX. In one embodiment, the second precursor solution comprises about 40 wt % AX.

The coating solvent and further coating solvent are selected for the sequential application of the coatings. Accordingly, the coating solvent is selected so that it can dissolve both $MX_2$ and AX. However, the further coating solvent must be selected so that it can dissolve AX, not $MX_2$. $MX_2$ should have a low, preferably substantially low solubility in the further coating solvent. In preferred embodiments, $MX_2$ is not soluble in the further coating solvent. This low solubility is required to ensure that the surface and structure of the applied $MX_2$ layer is not affected by the application of the second AX coating applied over the first applied $MX_2$ layer.

In the sequential deposition method/sequential type coatings, suitable solvents for the coating solvent are typically polar aprotic solvents including at least one of Dimethylformamide (DMF), Dimethyl sulfoxide (DMSO), γ-butyrolactone, acetone, acetyl acetone, ethyl acetoacetate N-Methyl-2-pyrrolidone (NMP), Dimethylacetamide (DMAC), Tetrahydrofuran (THF) or combinations thereof. Suitable solvents for the further coating solvent are typically polar protic solvents including isopropanol, n-butanol, isobutanol, ethanol, methanol, acetic acid, ethylene glycol, propylene glycol, glycerol, allyl alcohol, propagyl alcohol, inositol or combinations thereof. In some embodiments, the coating solvent comprises Dimethylformamide (DMF) and the further coating solvent comprises isopropanol (2-propanol), however, it should be appreciated that other combinations are possible.

The coating or layers of AX and the coating or layer of $MX_2$ and polymer additive can be applied by any number of suitable processes. Suitable processes include casting, doctor blading, screen printing, inkjet printing, pad printing, knife coating, meniscus coating, slot die coating, gravure printing, reverse gravure printing, kiss coating, micro-roll coating, curtain coating, slide coating, spray coating, flexographic printing, offset printing, rotatory screen printing, or dip coating. In one preferred embodiment, the at least one layer of AX is applied by dipping the $MX_2$ and polymer additive coated substrate into a solution of AX.

One of the reactants preferably comprises at least one compound having the formula $MX_2$, or at least one reaction constituent for forming at least one compound having the formula $MX_2$, in which M is selected from Pb, Sn, Ge, Ca, Sr, Cd, Cu, Ni, Mn, Co, Zn, Fe, Mg, Ba, Si, Ti, Bi, or In and X is selected from at least one of F, Cl, Br or I. In some embodiments, M is selected from $Pb^{2+}$, $Sn^{2+}$, $Ge^{2+}$, $Ca^{2+}$, $Sr^{2+}$, $Cd^{2+}$, $Cu^{2+}$, $Ni^{2+}$, $Mn^{2+}$, $Co^{2+}$, $Zn^{2+}$, $Fe^{2+}$, $Mg^{2+}$ or $Ba^{2+}$ and X is selected from at least one of $F^-$, $Cl^-$, $Br^-$ or $I^-$. In some embodiments, M is selected from Pb, Sn, Ge, Si, Ti, Bi, or In. In some embodiments, $MX_2$ comprises at least one of $PbCl_2$, $PbI_2$, $PbBr_2$, $SnCl_2$, $SnI_2$, $SnBr_2$, $ZnCl_2$, $ZnI_2$, $ZnBr_2$, $FeCl_2$ or $FeBr_2$. In preferred embodiments, M comprises Pb, and more preferably $MX_2$ comprises $PbCl_2$, $PbI_2$ or $PbBr_2$. It should be appreciated that this first reactant mixture/solution may comprise a single $MX_2$ compound or a mixture of different (two or more) $MX_2$ compounds in solution.

Similarly, one of the reactants preferably comprises at least one compound having the formula AX, or at least one reaction constituent for forming at least one compound having the formula AX, in which A comprises an ammonium group or other nitrogen containing organic cation and X is selected from at least one of F, Cl, Br or I. As discussed above, A can be selected from a large number of ammonium or nitrogen containing organic cations. In some embodiments, A comprises cations having the general formula $RCH_2NH_3^+$, $RC(NH_2)_2^+$, $R_aR_bCH_1NH_3^+$, $R_aR_bR_cCNH_3^+$, $R_aR_bNH_2^+$, or $R_aR_bR_cNH^+$, where R, $R_a$, $R_b$, $R_c$ comprises H or a substituted or unsubstituted alkyl group or groups, preferably a $C_1$ to $C_6$ substituted or unsubstituted alkyl or aryl group or groups. Whilst a number of organo-metal halide perovskite are possible, preferred A comprise at least one of $CH_3NH_3^+$, $HC(NH_2)_2^+$. It should be appreciated that this second reactant solution may comprise a single AX compound or a mixture of different (two or more) AX compounds in solution.

In preferred embodiments, AX is selected from the group consisting of $CH_3NH_3X$ and $HC(NH_2)_2X$. Again, X is selected from at least one of Cl, Br or I. Similarly, in preferred embodiments M comprises Pb. Accordingly, in preferred embodiments AX comprises $CH_3NH_3X$ and $MX_2$ comprises $PbX_2$.

The applied coating can be applied by any number of suitable application techniques. Suitable techniques for applying the applied coating substrate include, but should not be limited to, at least one of: casting, doctor blading, screen printing, inkjet printing, pad printing, knife coating, meniscus coating, slot die coating, gravure printing, reverse gravure printing, kiss coating, micro-roll coating, curtain coating, slide coating, spray coating, flexographic printing, offset printing, rotatory screen printing, or dip coating.

The applied coating can be applied to any suitable substrate. It should be appreciated that the substrate selected for the photoactive layer will be selected to suit the particular photoactive device and application thereof. Suitable substrates include polymers, metals, ceramics and glasses. In some embodiments, particularly flexible photoactive devices, such as flexible solar cell applications, the substrate comprises a polymer film.

As will be appreciated, the substrate can include one or more layers or coatings onto which the applied layer is applied. These coatings are preferably selected from at least one of:

at least one coating of a transparent conductive oxide (TCO);

at least one hole transporting layer comprising an organic or inorganic semiconductor; or at least one electron transporting layer comprising an organic or inorganic conductor.

The coatings applied to the substrate typically depend on the configuration of the photoactive device in which the applied photoactive layer forms is part of. In a conventional structure of a photoactive device layer the substrate includes at least one coating of a transparent conductive oxide (TCO) and at least one hole transporting layer applied to the TCO. In an inverted structure of a photoactive device layer the substrate includes at least one coating of a TCO and at least one electron transporting layer applied to the TCO. Of course various other layers are possible depending on the desired structure of the photoactive device, as would be evident to one skilled in the art.

The photoactive layer formed by the process of the present invention is one of a number of layers of a photovoltaic device such as a solar cell. Solar cells, particularly thin film and flexible solar cells are formed as a multilayer coating on a substrate. Each layer can be formed by one of a number of coating techniques. Suitable techniques include casting, doctor blading, screen printing, inkjet printing, pad printing, knife coating, meniscus coating, slot die coating, gravure printing, reverse gravure printing, kiss coating, micro-roll coating, curtain coating, slide coating, spray coating, flexographic printing, offset printing, rotatory screen printing, or dip coating.

A photoactive device including a photoactive layer formed by the process of the present invention can be formed as an inverted structure or a conventional structure. A conventional structure is formed with a substrate having the following layers successively layered on a surface thereof: a transparent conductive oxide (TCO) layer, followed by a hole transporting layer; followed by the photoactive layer; followed by an electron transporting layer, and followed by a conductor layer (typically a metal). An inverted structure is formed with a substrate having the following layers successively layered on a surface thereof: a transparent conductive oxide (TCO) layer, followed by an electron transporting layer; followed by the photoactive layer; followed by a hole transporting layer, and followed by a conductor layer (typically a metal). A hole transporting (p-type) layer can be any hole-conducting material with appropriate valence band edge.

The various layers can comprise a number of suitable components currently known in the art. For example:

Suitable transparent conductive oxides (TCO) include tin doped indium oxide (ITO), fluoride-doped tin oxide (FTO), doped zinc oxide such as aluminium doped zinc oxide (AZO), or indium doped cadmium-oxide;

Suitable hole transporting layers include a transparent conducting polymer such as at least one of Poly(3,4-ethylenedioxythiophene) (PEDOT), poly(3,4-ethylenedioxythiophene and polystyrene sulfonate mixture (PEDOT:PSS), poly(4,4-dioctylcyclopentadithiophene); Poly(3-hexylthiophene-2,5-diyl) (P3HT), Poly[bis(4-phenyl)(2,4,6-trimethylphenyl)amine] (PTAA), poly[N-9"-heptadecanyl-2,7-carbazole-alt-5,5-(4',7'-di-2-thienyl-2',1',3'-benzothiadiazole)] (PCDTBT), poly[2,6-(4,4-bis-(2-ethylhexyl)-4H-cyclopenta[2,1-b; 3,4-b]dithiophene)-alt-4,7(2,1,3-benzothiadiazole)] (PCPDTBT), poly(N-alkyldiketopyrrolopyrroledithienylthieno[3,2-b]thiophene) (DPP-DTT), 2,2(,7,7(-tetrakis-(N,N-dipmethoxyphenylamine)9,9(-spirobifluorene) (spiro-OMeTAD), $MoO_3$ or the like (with or without suitable dopants);

Suitable electron transporting layers include zinc oxide, titanium dioxide, tungsten trioxide or the like; and Suitable conductor layers comprise Au, Ag, C (for example graphite/carbon black, CNTs, vapour-grown carbon fibres graphene or the like), Al, Mg, Cu or suitable alloys thereof or the like.

It should be appreciated that the present invention can be used to form single junction or multijunction cells. Multijunction (MJ) solar cells comprise solar cells with multiple p-n junctions, preferably made of different semiconductor materials. Each material's p-n junction will produce electric current in response to different wavelengths of light. Multijunction cells can be produced by layering a series of perovskite layers/structures formed using the process of the present invention. The use of multiple semiconducting materials allows the absorbance of a broader range of wavelengths, improving the cell's sunlight to electrical energy conversion efficiency. Examples of multijunction cells include the use with Si as a tandem structure, but also including multijunction perovskites where a distinct advantage of electrodeposited or vapour deposited embodiments is the ability to form multi-layered stacks of thin-films over large areas. In this respect, quantification of the spectral band edge of perovskite materials of varying composition. For example, in some embodiments, successive layers of a halide series from I, Cl, Br etc. would enable spectral tuning of the device and lead to a broader spectral response and higher efficiency.

Accordingly, an optoelectronic device or photoactive device including a photoactive layer formed by the process of the present invention can be formed as a tandem structure. In a tandem structure or tandem devices, a stack of two photoactive devices is formed thereby including two stacked layers of a photoactive structure. The stack of solar cells work at the same time and improve efficiency of the overall device. For example, in some tandem solar cells, the device comprises a stack of two conventional structured photoactive devices. This structure would therefore comprise the following layers successively layered on a surface thereof: a transparent conductive oxide (TCO) layer, followed by a hole transporting layer (HTL); followed by a first photoactive layer; followed by an electron transporting layer (ETL), a transparent conductive oxide (TCO) layer, followed by a hole transporting layer (HTL); followed by a second photoactive layer; followed by an electron transporting layer (ETL) and followed by a conductor layer (typically a metal). In other tandem solar cells, the device may comprise a stack of two inverted structured photoactive devices. This structure would therefore comprise two stacked solar cell structures having the following layers successively layered on a surface thereof: a transparent conductive oxide (TCO) layer, followed by an electron transporting layer; followed by a first photoactive layer; followed by a hole transporting layer, a transparent conductive oxide (TCO) layer, followed by an electron transporting layer; followed by a second photoactive layer; followed by a hole transporting layer and followed by a conductor layer (typically a metal). The first and second photoactive layers of the above structures could be the same or a different perovskite layer. Similarly, the stacked structure could include two different types of solar cell configurations. For example, an organic solar cell or Si solar cell stacked with a solar cell including a photoactive layer produced according to the present invention. It should be appreciated that the other solar cell could comprise any other type of photoactive cell including organic solar cells and even other perovskite solar cells. A photoactive device such as a solar cell which includes the perovskite photoactive layer of the present invention could be one or both of the bottom cell or top cell of a tandem device. In some embodiments, the present invention is used to deposit a perovskite material with a suitable and complementary band gap would enable a broader spectral response of existing semiconductor photovoltaics, for example deposition of $CH_3NH_3PbI_3$ as a top-cell on silicon to form a tandem junction.

The applied coating is preferably coated on the substrate to produce a dry layer thickness from 100 nm to 600 nm. In some embodiments, the thickness can be from 200 to 400 nm, more preferably from 300 to 400 nm, and yet more preferably about 300 nm.

In some embodiments, the process of the present invention further includes the step of drying the applied coating. The drying step can comprise any number of drying process including air dry, convective drying, ambient drying, heat treatment, annealing or the like. In some embodiments, drying the applied coating includes heat treatment of the coated substrate at a temperature of at least 60° C., preferably at least 70° C., more preferably at least 100° C., and yet more preferably at least 120° C.

The photoactive coat of the present invention can function with or without the polymer additive present within the final form of the layer. In some embodiments, it can be preferable to remove the polymer additive as it can act as an impurity which affects the function of the photoactive layer. Therefore, some embodiments of the process include the further step of removing the polymer additive from the applied coating. This removal step can occur before, during or after the drying and/or crystallisation process of the photoactive layer. In some embodiments, the step of removing the polymer additive preferably occurs after the applied coating has dried.

The polymer additive can be removed using a number of different methods. In some embodiments, the step of removing the polymer additive includes washing the substrate and applied coating in a removal solvent. The removal solvent can comprise any suitable solvent. However, it is preferred for the removal solvent to be less polar than the coating solvent. Non limiting examples of suitable solvents include 2-propanol or chloroform.

In other embodiments, the polymer additive comprises a UV breakable polymer and the step of removing the polymer additive includes degrading the polymer additive using UV irradiation, preferably as a gas or volatile small molecule.

Where the photoactive layer is prepared using a sequential type coatings, the polymer additive can be removed either after the perovskite layer has crystallised or after the first layer (the $MX_2$ and polymer additive coating) has been applied, or while AX is reacting with $MX_2$. These options include solvent washing can be used on the $MX_2$ and polymer additive coating before or after coating of the AX solution, and use of a UV breakable polymer, enabling the polymer additive to be converted to gas or volatile small molecule by UV irradiation before or after application of AX coat over the prior $MX_2$ and polymer additive coating. In other embodiments, the polymer additive is removed from the applied coating while AX reacts with $MX_2$ to form $AMX_3$. In this process, the polymer additive is preferably removed during a dipping process when $MX_2$ is applied to the previously applied coating layer which includes $MX_2$.

The present invention also relates to one or more photoactive devices which include a photoactive layer formed using a process according to the present invention. The photoactive device can comprise a large range of photoelectric, photovoltaic and the like devices including but not limited photovoltaic cells, photoactive sensors, including photodetectors, or the like.

BRIEF DESCRIPTION OF THE FIGURES

The present invention will now be described with reference to the figures of the accompanying drawings, which illustrate particular preferred embodiments of the present invention, wherein:

FIG. 1 provides an illustration of the layers comprising a solar cell incorporating a photoactive layer according to the present invention in (A) a conventional solar cell structure; (B) an inverted solar cell structure; and (C) a tandem solar cell structure.

FIG. 2 provides a copy of a photograph of photoactive layer of perovskite solar cell fabricated by slot die coating from (A) 0.5M $CH_3NH_3PbI_3$ solution and (B) 0.5M $CH_3NH_3PbI_3$ solution with 1.5 wt % polyvinyl acetate (PVAc).

DETAILED DESCRIPTION

Figure 3:
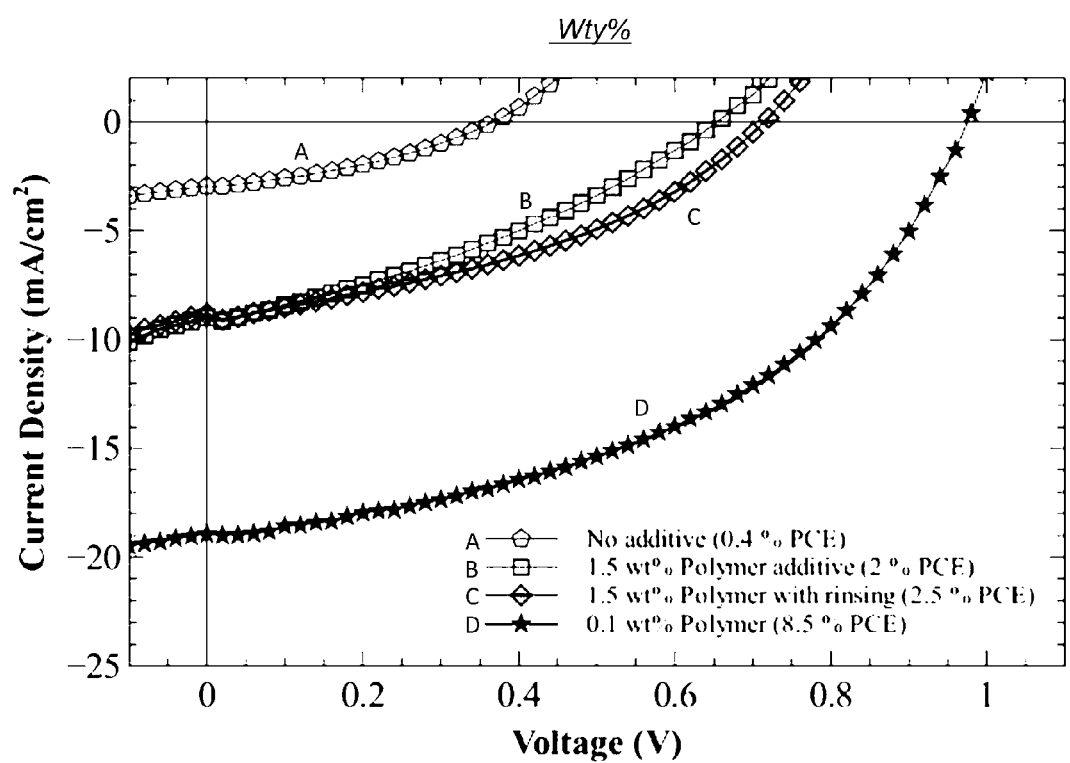
FIG. 3 is a plot of current density versus voltage of photovoltaic cells incorporating a perovskite photoactive layer formed by (A) spin coated with no polymer additive (control); (B) with polymer additive according to the present invention; (C) with polymer additive followed by solvent rinsing according to the present invention.

Photovoltaic cells, particularly thin film and flexible solar cells are formed as a multilayer coating on a substrate. As shown in FIG. 1, this multilayer coating structure can be arranged on the substrate in at least two different arrangements termed in the art as (A) a conventional structure, or (B) as an inverted structure (FIG. 1(B)).

As shown in FIG. 1(A), a conventional structure is formed on a substrate having the following layers successively layered on a surface thereof: a transparent conductor (such as a transparent conductive oxide (TCO), conducting polymer or thin metal) with or without conducting grids, followed by a hole transporting layer; followed by the photoactive layer; followed by an electron transporting layer, and followed by a conductor layer (typically a metal).

As shown in FIG. 1(B), an inverted structure is formed on a substrate having the following layers successively layered on a surface thereof: a transparent conductor (such as a transparent conductive oxide (TCO), conducting polymer or thin metal) with or without conducting grids, followed by an electron transporting layer; followed by the photoactive layer; followed by a hole transporting layer, and followed by a conductor layer (typically a metal).

It should be appreciated that the hole transporting layer or electron transporting layers could be omitted in some embodiments of the above conventional and inverted structures. These layers can therefore be optional in certain embodiments.

As shown in FIG. 1(C), a tandem structure is formed on a substrate using two stacked solar cell structures, i.e. a top cell and a bottom cell of the conventional or inverted structure. The stacked structure includes two different solar cell of the same or different configurations. The example provided comprises the following layers successively layered thereon: Transparent conductor layer (TCO, conducting polymer or thin metal) with or without collecting grids; followed by a Top cell—a Perovskite solar cell either type A (FIG. 1A) or type B (FIG. 1B); followed by a Transparent conductor layer (TCO, conducting polymer or thin metal) with or without conducting grids; followed by a Bottom cell (perovskite, organic, inorganic or silicon solar cell); followed by a Metal (or conductor) layer. A substrate such as glass, plastic, metal or ceramic could also be used but should be understood to be optional. Tandem and multilayer/junction structures will be discussed in more detail below.

Each layer can be formed by one of a number of coating techniques know in the art including casting, doctor blading, screen printing, inkjet printing, pad printing, knife coating, meniscus coating, slot die coating, gravure printing, reverse gravure printing, kiss coating, micro-roll coating, curtain coating, slide coating, spray coating, flexographic printing, offset printing, rotatory screen printing, or dip coating. It should be appreciated that a person skilled in the art would be able to adopt a suitable technique to apply each layer based on techniques known in the art.

The various layers can comprise a number of suitable components currently known in the art. Examples include:
Suitable transparent conductive oxides (TCO) include tin doped indium oxide (ITO), fluoride-doped tin oxide (FTO), doped zinc oxide such as aluminium doped zinc oxide (AZO), or indium doped cadmium-oxide;
Suitable hole transporting layers include a transparent conducting polymer such as at least one of Poly(3,4-ethylenedioxythiophene) (PEDOT), poly(3,4-ethylenedioxythiophene and polystyrene sulfonate mixture (PEDOT:PSS), poly(4,4-dioctylcyclopentadithiophene); doped P3HT (Poly(3-hexylthiophene-2,5-diyl)) or the like;

Suitable electron transporting layers include zinc oxide, titanium dioxide or the like;

Suitable conductor layers comprise aluminium, silver, magnesium, copper, gold or suitable alloys thereof or the like; and Suitable substrates include metals, polymers, ceramics or glasses.

In a perovskite type photoactive device, such as a photovoltaic cell, the photoactive layer comprises an organic-inorganic perovskite-structured semiconductor. The present invention provides a process of forming a photoactive layer of a perovskite type photoactive device. The method comprises the step of applying at least one coating of a perovskite precursor solution and a polymer additive to a substrate. The perovskite precursor solution comprises a perovskite precursor/reaction constituent for forming at least one perovskite compound dissolved in a coating solvent selected from a polar aprotic solvent, and the polymer additive is soluble in said coating solvent. As previously discussed, the Applicant has found that the polymer additive acts as an ideal crystallisation retardant for the formation of a perovskite compound comprising a perovskite type photoactive layer.

The photoactive layer formed by the present invention can be formed in two methods:

In a first method, the applied coating can be applied in a single coating step, in which the applied coating comprises a mixture of the perovskite precursor solution and the polymer additive. The mixture can be applied as a coating onto the substrate, or as separate layers of the components (polymer additive and precursor mixture) which mix once applied to the substrate.

In a second method, the applied coating is applied in at least two steps using reactant species which react once the coating layers mix to form the perovskite structure. This method comprises a sequential coating or deposition process. In these embodiments, a first coating comprising a first perovskite precursor solution including a metal halide ($MX_2$) component mixed with the polymer additive is applied to a substrate, then a second coating comprising a second perovskite precursor solution including an ammonium halide or other organic halide reactant (AX) which forms to the selected perovskite compound is applied. In these sequential type coatings, once the layers are applied, $MX_2$ and AX react to form $AMX_3$, and then the polymer additive acts as a retardant to the subsequent crystallisation of the $AMX_3$ perovskite layer.

The first perovskite precursor solution comprises the component $MX_2$ and the polymer additive dissolved in a coating solvent. The second perovskite precursor solution comprises the component AX dissolved in a further coating solvent. The coating solvent and further coating solvent are selected for the sequential application of the coatings. Accordingly, the coating solvent is selected so that it can dissolve both $MX_2$ and AX. However, the further coating solvent must be selected so that it can dissolve AX, not $MX_2$. $MX_2$ should have a low, preferably substantially low solubility or no solubility in the further coating solvent to ensure that the surface and structure of the applied $MX_2$ layer is not affected by the application of the second AX coating applied over the first applied $MX_2$ layer. Suitable solvents for the coating solvent are typically polar aprotic solvents including at least one of Dimethylformamide (DMF), Dimethyl sulfoxide (DMSO), γ-butyrolactone, acetone, acetyl acetate, ethyl acetoacetate N-Methyl-2-pyrrolidone (NMP), Dimethylacetamide (DMAC), Tetrahydrofuran (THF) or combinations thereof. Suitable solvents for the further coating solvent are typically polar protic solvents including isopropanol, n-butanol, isobutanol, ethanol, methanol, acetic acid, ethylene glycol, propylene glycol, glycerol, allyl alcohol, propagyl alcohol, inositol or combinations thereof.

The applied coatings in each method can be applied by any number of suitable application techniques. Suitable techniques for applying the applied coating to the substrate include, but should not be limited to, at least one of: casting, doctor blading, screen printing, inkjet printing, pad printing, knife coating, meniscus coating, slot die coating, gravure printing, reverse gravure printing, kiss coating, micro-roll coating, curtain coating, slide coating, spray coating, flexographic printing, offset printing, rotatory screen printing, or dip coating.

The process of the present invention can further include the step of drying the applied coating. The drying step can comprise any number of drying process including air dry, convective drying, ambient drying, heat treatment, annealing or the like at a temperature suitable for the perovskite layer to crystallise.

The polymer additives can be added in to perovskite precursor solution can be left within the photoactive layer or can be removed. To remove the polymer additive one of the following techniques may be used:

a. Solvent washing can be used. As the perovskite layer of the present invention is only soluble in polar solvents such as Dimethylformamide (DMF) or methanol, less polar solvent such as 2-propanol or chloroform can be used to remove the polymer additive; or b. A UV breakable polymer additive can be used. The polymer additive can be converted to gas or volatile small molecule by UV irradiation.

If the sequential coating (Method 2) is used, the polymer additive can be removed using one of the following further techniques:

a. Solvent washing can be used on the $MX_2$ and polymer additive coating before dipping or coating of AX solution;

b. Polymer can be removed while AX is reacting with $MX_2$, for example during a dipping process; or c. A UV breakable polymer can be used. The polymer additive can be converted to gas or volatile small molecule by UV irradiation before or after application of AX coat over the prior $MX_2$ and polymer additive coating.

As discussed previously, a large number of reaction constituent for forming at least one perovskite compound, perovskite compounds, solvents and polymer additives can be used in the present invention. In an exemplary embodiment, illustrated in the following examples, the perovskite compound comprises an organo-lead Iodide perovskite, preferably comprising at least one of $CH_3NH_3PbI_3$ or $HC(NH_2)_2PbI_3$, the coating solvent comprises at least one of DMF, DMSO, γ-butyrolactone, acetyl acetone or ethyl acetoacetate, and the polymer additive is selected from the group consisting of poly vinyl alcohol, poly vinyl acetate (PVAc) ABS, poly amides, poly acrylics, poly imide, poly acrylonitrile, poly butyl methacrylate, poly butadiene, poly carboxy methyl cellulose, poly ethers, poly ethylene acrylates, poly glycols, poly isocyanates, poly methacrylates, poly vinyl butyral, poly vinyl fluoride, poly vinyl methyl ethers, poly amines, polyethylene oxide, ethylene glycol, Poly(2-ethyl-2-oxazoline) and combinations thereof. It should however be understood that the present invention is not limited to those specific components, but rather can comprise a wide range of components as covered above.

It should be appreciated that the photoactive layer of the present invention can be incorporated into the layered structure of a variety of optoelectronic and photoactive devices having both conventional and inverted structures discussed above. The photoactive layer of the present invention can also be incorporated into multijunction structures, for example tandem photoactive structures including two stacked layers of photoactive structures. A photoactive device such as a solar cell which includes the perovskite photoactive layer of the present invention could be one or both of the bottom cell or top cell of a tandem device. In some embodiments, the other solar cell could comprise any other type of photoactive cell including organic solar cells and even other perovskite solar cells. For example, a device structure could comprise one of:

Glass/TCO/ETL/perovskite I/HTL/TCO/ETL/perovskite ||/HTL/metal electrode; or

PET/organic solar cell (TCO/ZnO/P3HT:PCBM/PEDOT: PSS)/ETL/perovskite/HTL/metal electrode.

EXAMPLES

Example 1—PVAc Polymer Additive (1) Material Preparation.
Preparation of ZnO Precursor:

A ZnO precursor was prepared by dissolving zinc acetate dihydrate ($Zn(CH_3COO)_2 \cdot 2H_2O$, Aldrich, 99.9%, 1 g) and ethanolamine ($NH_2CH_2CH_2OH$, Aldrich, 99.5%, 0.28 g) in 2-methoxyethanol ($CH_3OCH_2CH_2OH$, Aldrich, 99.8%, 10 mL) under vigorous stirring for 12 h.

Preparation of ZnO Nanoparticle:

ZnO nanoparticles were synthesized from zinc acetate dehydrate and sodium hydroxide (NaOH). The zinc acetate solution was prepared by dissolving zinc acetate dihydrate (0.230 g) in ethanol (15 mL) at 75° C. and the NaOH solution was prepared by dissolving NaOH (0.1 g) in ethanol (5 mL). The NaOH solution was added dropwise to the zinc acetate solution at RT under vigorous stirring. Subsequently, the transparent suspension showed green emission under excitation by an UV lamp. The transparent suspension of nanoparticles was purified by repeated precipitation with heptane, centrifuging and redispersion in EtOH. The washed suspension of ZnO nanoparticles was used for device fabrication.

Preparation of Methyl ammonium iodide ($CH_3NH_3I$):

$CH_3NH_3I$ was synthesized by reacting 50 mL methylamine (33 wt % in EtOH, Aldrich) and 30 mL of hydroiodic acid (57 wt % in water, Aldrich) in 250 mL round bottomed flask at 0° C. for 2 h with stirring. The precipitate was recovered by evaporation at 50° C. for 1 h. The product, methyl ammonium iodide $CH_3NH_3I$, was washed with diethyl ether three times. The solid was dissolved in hot ethanol. Insoluble impurities were removed by filtration. The solution was cooled down for recrystallization. Crystalized $CH_3NH_3I$ was obtained by filtration and dried under vacuum at 60° C. for at least 10 h.

(2) Device Preparation (ITO-Glass/ZnO/Perovskite layer/ doped P3HT layer/AG)

Pre-patterned ITO-coated glass substrates (Lumtec, 5 Ω/sq) were cleaned by successively sonicating in a detergent solution, deionized water, acetone and 2-propanol (each 10 min). The substrates were then exposed to a UV-ozone (Novascan PDS-UVT, 10 min).

A ZnO layer was prepared by spin coating at 5000 rpm for 40 sec on top of the ITO-glass substrate or slot die coating at 2 mm/sec coating speed with 1 ul/cm$^2$ of solution flow. The films were annealed at 150° C. for 10 min in air.

To fabricate the perovskite photoactive layer, three methods were used. Method 1 comprises a single step coating using a blend solution. Method 2 comprises two step sequential depositions of $PbI_2$ and $CH_3NH_3I$. Method 3 comprises the additional step of solvent removal of the polymer additive from the layer. A control perovskite photoactive layer was also prepared by spin coating as set out in Method 4.

Method 1: Coating Mixture
Method 1A: 1.5 wt % Polymer Additive 0.5 M $PbI_2$ (99%, Sigma-Aldrich) and $CH_3NH_3I$ in DMF solution was prepared. 100 mg/ml PVAc solution was prepared separately in DMF. 0.05 ml of the solution was added to 1 ml of the perovskite solution to make ~1.5 wt % (relative to $PbI_2+CH_3NH_3I$) solution. To achieve 300-400 nm thick perovskite layer, the solution was used as is or diluted to half concentration. Thickness of the film was controlled by coating parameters in slot die coating process. ~300 nm film could be fabricated from 0.25 M solution with the polymer additive at 3 mm/sec coating speed with 1 μl/cm$^2$ of solution flow. The wet film fabricated by the coating was then dried under air blow and baked at 100° C. for 30 sec.

Method 1B: 0.1% Polymer Additive 0.8 M $PbI_2$ (99%, Sigma-Aldrich) and $CH_3NH_3I$ in DMF solution was prepared. 100 mg/ml PVAc solution was prepared separately in DMF and added to the perovskite precursor solution to make 0.1 wt % (relative to $PbI_2+CH_3NH_3I$) solution. Thickness of the film was controlled by coating parameters in slot die coating process to achieve 300-400 nm thick film using a 3 mm/sec coating speed with 1 μl/cm$^2$ of solution flow. The wet film fabricated by the coating was then dried under strong air blow and baked at 100° C. for 30 sec.

Method 1C: No polymer Additive

Additionally, a comparison layer without PVAc was also prepared using 0.5 M $PbI_2$ (99%, Sigma-Aldrich) and $CH_3NH_3I$ in DMF solution. Again, to achieve 300-400 nm thick perovskite layer, the solution was used as is or diluted to half concentration. Thickness of the film was controlled by coating parameters in slot die coating process. ~300 nm film could be fabricated from 0.25 M solution at 3 mm/sec coating speed with 1 μl/cm$^2$ of solution flow. The wet film fabricated by the coating was then dried under air blow and baked at 100° C. for 30 sec.

Method 2: Sequential Coating 0.5 M $PbI_2$ solution with 1.5 wt % PVAc was deposited on ZnO layer by slot die coating at 3 mm/sec coating speed with 1 μl/cm$^2$ solution flow. The film can be converted to perovskite layer by dipping the film into 10 mg/ml of $CH_3NH_3I$ in 2-propanol for 40 sec. After dipping, the film need to be washed by 2-propanol and dried by air blowing. To complete perovskite crystal formation, the film was heated at 100° C. for 30 sec. Alternatively, the $PbI_2$ layer can be converted to perovskite layer by deposition of a $CH_3NH_3I$ (10 mg/ml) in 2-propanol solution by slot die coating at 3 mm/sec coating speed with 20 μl/cm$^2$ solution flow. The coating can be done either at room temperature or higher temperature (typically 70° C.). In this case, no air blowing or additional heating step was required.

Method 3: Removal of polymer Additives

The properties of a perovskite layer made by method 1 and 2 can be improved by removing the insulating polymer additives. A Perovskite layer with 1.5 wt % PVAc was dipped into ethylacetate for 40 sec. The solvent is a very good solvent for the polymer additive as it has the same chemical structure as the repeating unit of the polymer. It was confirmed experimentally that the perovskite film was not soluble in this solvent. Therefore, it selectively removes the polymer additives only.

Method 4: Control—Spin Coating

A control device prepared by spin coating was also prepared using 0.8 M PbI2 (99%, Sigma-Aldrich) and $CH_3NH_3I$ in DMF solution. With a conventional spin coating procedure, only a very rough film could be fabricated due to crystallization. Therefore, heated substrates were used. An ITO glass was attached to a 5 mm thick Al plate. The plate was heated to 50° C. on a hot plate and transferred to a spin coater. About 0.1 ml of solution was poured on the substrate with minimum time delay and coating was done at 2000 rpm for 30 sec. The film was then heated at 100° C. for 30 sec.

A hole transporting layer (doped P3HT) was prepared on the Perovskite layer by spin coating at 3000 rpm for 30 sec using a mixture of P3HT (15 mg) in 1 ml dichlorobenzene, 6.8 µl of Li-bis(trifluoromethanesulfonyl) imide (28.3 mg/ml in acetonitrile) solution and 3.4 µl of 4-tert-butylpyridine.

The films were transferred to a vacuum evaporator for electrode deposition. An Ag electrode was made by thermal evaporation under vacuum ($<1\times10^{-6}$ torr) through a metal shadow mask.

An example of a photoactive layer produced by Method 1 (a) without PVA polymer additive and (b) with the PVA polymer additive is shown in FIG. 2. Comparing the two films, it can firstly be observed that the photoactive layer without the polymer additive (FIG. 2(A)) has an uneven and irregular coating on the surface, with a large number of holes and defects through the coating. In comparison the photoactive layer formed with the PVA polymer additive (FIG. 2(B)) has a substantially uniform coating. Additionally, although, the polymer interfered with the formation of perovskite crystal during drying process, the film showed typical colour of perovskite layer after thermal annealing.

The produced photovoltaic devices were tested with an Oriel solar simulator fitted with a 1000 W Xe lamp filtered to give an output of 100 mW $cm^{-2}$ at AM1.5. The lamp was calibrated using a standard, filtered Si cell (PV measurements) which was subsequently cross-calibrated with a standard reference cell traceable to the National Renewable Energy Laboratory (NREL, United States department of Energy). The devices were tested using a Keithley 2400 Sourcemeter controlled by Labview software. The current density vs voltage (J-V) characteristics of the solar cells were measured and device performance extracted from the J-V data.

Firstly, it was found that each photovoltaic cell including a perovskite layer with polymer additive worked. In comparison, the photovoltaic cell including a perovskite layer formed without the polymer additive using slot die coating did not produce a working photovoltaic cell. It was therefore necessary to use a control device with a layer formed using spin coating.

The photovoltaic devices formed with (A) no polymer additive (Method 4-control); (B) 1.5 wt % polymer additive within the photoactive layer formed by Method 1 and (C) polymer additive within the photoactive layer and then removed through solvent rinsing (Method 3) and (D) 0.1 wt % polymer additive within the photoactive layer formed by Method 1, were tested to determine current density and voltage generation, the results of which are shown in FIG. 3.

The data in FIG. 3 shows that each of the devices worked. As can be appreciated, the J-V curves show the performance of each device and the area above the curves (up to the 0 current value and across to the 0 voltage value) is proportional to the amount of power produced and therefore the power conversion efficiency (PCE). Thus:

(A) the no additive device has a small current and voltage and a correspondingly small PCE (0.4%).
(B) The device with a perovskite photoactive layer formed with a 1.5 wt % polymer additive has a greater current, voltage and PCE (2%) compared with the no additive device.
(C) The device with a perovskite photoactive layer formed with a 1.5 wt % polymer additive followed by solvent rinsing (Method 3) has a better current, voltage and PCE (2.5%).
(D) The device with a perovskite photoactive layer formed with a 0.1 wt % polymer additive (Method 1B) has the best current, voltage and PCE (8.5%).

The results therefore show that a photovoltaic device including a perovskite photoactive layer formed with a polymer additive with or without rinsing in accordance with the present invention has a much better current, voltage and PCE compared to a photovoltaic device including a perovskite photoactive layer formed without the polymer additive, with the solvent rinsing device having the greatest effect.

The results additionally show that even 0.1 wt % of polymer additive was effective to improve processability of perovskite solution. However, given the favourable PCE, it appears that this amount was low enough to not substantially hinder current flow through the layer and device. Therefore, the device formed using Method 1B showed much more current and the highest open circuit voltage (Voc) of the devices tested. Whilst not wishing to be limited to any one theory, the inventor considers this result to be due to dense pinhole free layer which reduce leakage current through defects.

Those skilled in the art will appreciate that the invention described herein is susceptible to variations and modifications other than those specifically described. It is understood that the invention includes all such variations and modifications which fall within the spirit and scope of the present invention.

Where the terms "comprise", "comprises", "comprised" or "comprising" are used in this specification (including the claims) they are to be interpreted as specifying the presence of the stated features, integers, steps or components, but not precluding the presence of one or more other feature, integer, step, component or group thereof.

Future patent applications may be filed in Australia or overseas on the basis of or claiming priority from the present application. It is to be understood that the following provisional claims are provided by way of example only, and are not intended to limit the scope of what may be claimed in any such future application. Features may be added to or omitted from the provisional claims at a later date so as to further define or re-define the invention or inventions.

The invention claimed is:

1. A process of forming a thin film photoactive layer of a perovskite photoactive device comprising:
applying at least one coating to a substrate, the coating comprising at least one perovskite precursor solution and a crystallisation retardant for perovskite crystallisation comprising at least one polymer additive; and crystallizing a perovskite photoactive layer on the substrate, the perovskite photoactive layer comprising a continuous and substantially uniform thin film perovskite layer, wherein the polymer additive comprises from 0.01 to 5 wt % of reaction constituent; and wherein the at least one perovskite precursor solution comprises at least one reaction constituent for forming at least one perovskite compound having the formula $AMX_3$ dissolved in a coating solvent selected from at least one polar aprotic solvent, the polymer additive being soluble in said coating solvent, and in which A comprises an ammonium group or other nitrogen containing organic cation, M is selected from Pb, Sn, Ge, Ca, Sr, Cd, Cu, Ni, Mn, Co, Zn, Fe, Mg, Ba, Si, Ti, Bi, or In, and X is selected from at least one of F, Cl, Br or I, and wherein the polymer additive retards the crystallisation rate of the perovskite precursor solution during perovskite crystallisation.

2. A process according to claim 1, wherein the coating solvent is at least one of Dimethylformamide (DMF), Dimethyl sulfoxide (DMSO), γ-butyrolactone, acetone, acetyl acetone, ethyl acetoacetate N-Methyl-2-pyrrolidone (NMP), Dimethylacetamide (DMAC), Tetrahydrofuran (THF) or combinations thereof.

3. A process according to claim 1, wherein the polymer is selected from the group consisting of poly vinyl alcohol, poly vinyl acetate (PVAc), Acrylonitrile butadiene styrene (ABS), poly amides, poly acrylics, poly imide, poly acrylonitrile, poly butyl methacrylate, poly butadiene, poly carboxy methyl cellulose, poly ethers, poly ethylene acrylates, poly glycols, poly isocyanates, poly methacrylates, poly vinyl butyral, poly vinyl fluoride, poly vinyl methyl ethers, poly amines, polyethylene oxide, polyethylene glycol, Poly (2-ethyl-2-oxazoline) and combinations thereof.

4. A process according to claim 1, wherein the applied coating comprises a mixture of the perovskite precursor solution and the polymer additive.

5. A process according to claim 1, wherein the perovskite precursor solution comprises a mixture of at least one $MX_2$, at least one of AX and at least one polymer additive dissolved in the coating solvent, in which A comprises an ammonium group or other nitrogen containing organic cation, M is selected from Pb, Sn, Ge, Ca, Sr, Cd, Cu, Ni, Mn, Co, Zn, Fe, Mg, Ba, Si, Ti, Bi, or In, and X is selected from at least one of F, Cl, Br or I.

6. A process according to claim 5, wherein AX is selected from the group consisting of $CH_3NH_3X$ and $HC(NH_2)_2X$, and wherein X is selected from at least one of F, Cl, Br or I.

7. A process according to claim 5, wherein M comprises Pb.

8. A process according to claim 1, wherein the step of applying at least one coating comprises:

coating at least one layer of a first perovskite precursor solution comprising at least one $MX_2$ and polymer additive dissolved in the coating solvent, thereby forming a perovskite precursor coating;

wherein M is selected from at least one of Pb, Sn, Ge, Ca, Sr, Cd, Cu, Ni, Mn, Co, Zn, Fe, Mg, Ba, Si, Ti, Bi, or In; and X is selected from at least one of F, Cl, Br or I.

9. A process according to claim 8, further comprising:

coating at least one layer of a second perovskite precursor solution comprising at least one of AX dissolved in a further coating solvent onto the perovskite precursor coating, wherein X is selected from at least one of F, Cl, Br or I; and A comprises an ammonium group or other nitrogen containing organic cation.

10. A process according to claim 9, wherein the step of applying at least one coating comprises:

applying a layer of the first perovskite precursor solution onto the substrate; and coating at least one layer of the second perovskite precursor solution onto the first perovskite precursor solution layer.

11. A process according to claim 9, wherein the coating of the second perovskite precursor solution is applied by dipping the first perovskite precursor solution coated substrate into a solution of the second perovskite precursor solution.

12. A process according to claim 9, wherein $MX_2$ and AX are soluble in the coating solvent, AX is soluble in the further coating solvent, and $MX_2$ has a low to zero solubility in the further coating solvent, and wherein the further coating solvent is at least one of including isopropanol, n-butanol, isobutanol, ethanol, methanol, acetic acid, ethylene glycol, propylene glycol, glycerol, allyl alcohol, propagyl alcohol, inositol or combinations thereof.

13. A process according to claim 1, wherein the step of applying at least one coating comprises:

coating at least one layer of a first perovskite precursor solution comprising at least one $MX_2$ and polymer additive dissolved in the coating solvent; and coating at least one layer of a second perovskite precursor solution at least one of AX dissolved in a further coating solvent, wherein M is selected from at least one of Pb, Sn, Ge, Ca, Sr, Cd, Cu, Ni, Mn, Co, Zn, Fe, Mg, Ba, Si, Ti, Bi, or In; X is selected from at least one of F, Cl, Br or I; and A comprises an ammonium group or other nitrogen containing organic cation.

14. A process according to claim 1, wherein the perovskite compound comprises an organo-metal halide perovskite, and wherein the perovskite compound comprises at least one of $CH_3NH_3MX_3$ or $HC(NH_2)_2MX_3$, in which, M is selected from Pb, Sn, Ge, Ti, Bi, or In; and X is selected from at least one of F, Cl, Br or I.

15. A process according to claim 14, wherein the perovskite compound comprises an organo-lead halide perovskite.

16. A process according to claim 15, wherein the organo-lead halide perovskite is at least one of $CH_3NH_3PbX_3$ or $HC(NH_2)_2PbX_3$, in which X is selected from at least one of F, Cl, Br or I.

17. A process according to claim 1, wherein the polymer additive comprises from 0.05 to 5 wt % of reaction constituent for forming at least one perovskite compound.

18. A process according to claim 1, wherein the perovskite precursor solution comprises from 5 to 75 wt % reaction constituent for forming at least one perovskite compound.

19. A process according to claim 1, wherein the substrate includes one or more layers or coatings selected from at least one of:

at least one coating of a transparent conductive oxide (TCO);

at least one hole transporting layer comprising an organic or inorganic semiconductor; or at least one electron transporting layer comprising an organic or inorganic conductor.

20. A process according to claim 1, wherein the applied coating is coated on the substrate to produce a dry layer thickness from 100 nm to 600 nm.

21. A process according to claim 1, further including the step of: removing the polymer additive from the applied coating.

22. A process according to claim 1, wherein the substrate is a flexible substrate.

23. A process according to claim 1, wherein the formed perovskite photoactive layer is located between at least one hole transporting layer comprising an organic or inorganic semiconductor, and at least one electron transporting layer, comprising an organic or inorganic conductor, the perovskite layer consisting essentially of a crystalline perovskite.

* * * * *